(12) United States Patent
Yeh

(10) Patent No.: US 6,306,701 B1
(45) Date of Patent: Oct. 23, 2001

(54) SELF-ALIGNED CONTACT PROCESS

(75) Inventor: Wen-Kuan Yeh, Chupei (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/294,594

(22) Filed: Apr. 20, 1999

(51) Int. Cl.[7] .............................................. H01L 21/8238
(52) U.S. Cl. ......................... 438/231; 438/305; 438/239; 438/229
(58) Field of Search ................................... 438/305, 306, 438/303, 307, 239, 254, 238, 253, 255, 256, 231, 286, 229, 230, 301; 257/344

(56) References Cited

U.S. PATENT DOCUMENTS

| 5,436,482 | * | 7/1995 | Ogoh | 257/344 |
| 5,747,373 | * | 5/1998 | Yu | 438/305 |
| 5,849,616 | * | 12/1998 | Ogoh | 438/231 |
| 5,895,239 | * | 4/1999 | Jeng et al. | 438/239 |

* cited by examiner

Primary Examiner—Charles Bowers
Assistant Examiner—Laura Schillinger

(57) ABSTRACT

A self-aligned contact process. A substrate is provided. A gate including a polysilicon layer and a metal silicide layer is formed on the substrate. A cap layer is formed on the gate to protect the gate. A first spacer is formed on the sidewall of the gate. A first ion implantation is performed using the gate and the first spacer as a first mask to form lightly doped regions in the substrate. A conformal liner layer is formed on the cap layer, the first spacer and the substrate. An insulating layer is formed on the conformal liner layer. A part of the insulating layer and a part of the liner layer are removed until exposing the cap layer. A part of the liner layer remaining on the first spacer and a part of the insulating layer remaining on the remaining liner layer are used as a second spacer. A second ion implantation is performed to form source/drain regions with lightly doped drain (LDD) structures in the substrate beside the second spacer. An inter-layer dielectric layer is formed over the substrate and then is etched to form a contact opening therein that exposes a part of the source/drain regions.

9 Claims, 4 Drawing Sheets

SELF-ALIGNED CONTACT PROCESS

BACKGROUND OF THE INVENTION

1. Field of the Invention

The invention relates to process for fabricating semiconductor devices, and more particularly to a self-aligned contact process for fabricating semiconductor devices.

2. Description of the Related Art

The semiconductor industry is continually striving to improve the performance of semiconductor devices, while still attempting to reduce the size thereof for faster but lower cost devices. To enhance the integration on the semiconductor, for example, in the structure of a Dynamic Random Access Memory (DRAM), reductions are proposed in the source/drain contact areas on metal oxide semiconductor (MOS). Therefore, while the areas for source/drain are reduced, the formation of contact openings on the source/drain in MOS to be filled with conductive material and the alignment thereof are important tasks.

A self-aligned contact process is developed for achieving the above goals, which process allows smaller devices to be constructed. FIGS. 1A to 1C schematically illustrate the cross-sectional representations of a conventional self-aligned contact process.

With reference to FIG. 1A, a gate oxide 105 and a gate 110 are provided on a semiconductor substrate 100. The gate 110 is composed of a doped polysilicon layer 120 and a tungsten silicide layer 130. A silicon nitride layer 140 is used as a passivation layer for the gate 110.

In FIG. 1B, a conformal liner layer 150 is formed on the gate oxide 105, the gate 110 and the silicon nitride layer 140. A spacer 160 is formed on the sidewall 155 of the liner layer 150. The material of the liner layer 150 is silicon oxide, while the material of the spacer is silicon nitride.

Referring to FIG. 1C, an insulating layer 170 is formed by chemical vapor deposition (CVD) and then is etched by photolithography. The material of an insulating layer 170 is silicon oxide. In this process, since the top surface and the side wall of the gate 110 are protected by the silicon nitride layer 140 and the spacer 160, a selective etching of silicon oxide 170 is performed to expose the substrate between the spacers 160 as a contact opening 180. However, since both the material of the liner layer 150 and the insulating layer 170 are silicon oxide, when selectively etching the insulating layer 170, the liner layer 150 is simultaneously etched to result in a defect 190. Furthermore, in the subsequent procedure, before the conductive material fills the contact opening 180, the semiconductor substrate is stripped with RCA solution ($H_2O_2/NH_4OH/H_2O$ solution) which can etch away the silicon oxide. During the step of stripping the substrate with RCA solution, the defect 190 is etched more to expose the tungsten silicide 130, and even to expose the doped polysilicon layer 120. When filling the contact opening 180 with conductive material for forming the conductive line, the defect 190 is filled at same time. A short occurs between the gate 110 and conductive line.

One approach for resolving the above-mentioned problem is to employ a thinner liner layer 150 to reduce the possibility of etching the liner layer 150. Typically, the thickness of the liner layer 150 should be at least 200 Å. In this approach, a thickness of 100–200 Å for the liner layer 150 is suggested. However, one purpose of the liner layer 150 is to decrease stress in the spacer 160 during the thermal treatment in the following procedures. Therefore, the thinner liner layer will result in the dislocation of the substrate.

Another approach for resolving the above-mentioned problems is the formation of a liner layer by a thermal oxidation process, rather than by chemical vapor deposition as used in the conventional process. In the thermal oxidation process, the sidewall of the doped polysilicon layer and tungsten silicide layer of the gate is formed on a passivation layer, while no oxide is formed on the top surface of the gate, which is silicon nitride. In such a case, the liner layer on the sidewall of the gate is embedded in the spacer. Therefore, no defect in the liner layer is formed during the etching process. However, an additional oxidation process is incorporated and thermal treatment results in adversely affecting the substrate, such as causing a dislocation of the substrate.

Therefore, a need exists to avoid the occurrence of a short between a conductive line and a gate in the self-aligned contact process.

SUMMARY OF THE INVENTION

The invention provides a self-aligned contact process to insulate a gate and a conductive material filling in a contact. An occurrence of short between the conductive material and the gate can thus be avoided.

The invention provides a self-aligned contact process. A substrate is provided. A gate including a polysilicon layer and a metal silicide layer is formed on the substrate. A cap layer is formed on the gate to protect the gate. A first spacer is formed on the sidewall of the gate. A first ion implantation is performed using the gate and the first spacer as a first mask to form lightly doped regions in the substrate. A conformal liner layer is formed on the cap layer the first spacer and the substrate. An insulating layer is formed on the conformal liner layer. A part of the insulating layer and a part of the liner layer are removed until exposing the cap layer. A part of the liner layer remaining on the first spacer and a part of the insulating layer remaining on the remaining liner layer are used as a second spacer. A second ion implantation is performed to form source/drain regions with lightly doped drain (LDD) structures in the substrate beside the second spacer. An inter-layer dielectric layer is formed over the substrate and then is etched to form a contact opening therein to expose a part of the source/drain regions.

Since the spacers and the liner layer are made from different materials, the etching selectivity between the spacers and the liner layer is large. The first spacer can prevent the gate from being damaged while forming the contact opening by self-alignment. The first spacer serves as an offset spacer. The lightly doped regions are formed after forming the first spacer so that a distance between the lightly doped regions becomes longer than a distance between conventional lightly doped regions. The short channel effect can thus be prevented. The gate, the gate oxide layer and the lightly doped regions constitute a structure that serves as a parasitic capacitor. A capacitance of the parasitic capacitor decreases according to the increased distance between the lightly doped regions.

Furthermore, the first spacer is located on the sidewall of the gate so that the metal silicide layer is not attacked while etching the inter-layer dielectric layer to form the contact opening. This can suppress gate resistance degradation and the process window for self-aligned contact formation can be enhanced.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

The process described below does not form a complete process flow for a self-aligned contact process in fabrication of integrated circuits. The present invention can be practiced in conjunction with integrated circuit fabrication techniques currently used in the art and only as much of the commonly practiced process steps are included as is necessary for an understanding of the present invention.

Figure 1A:
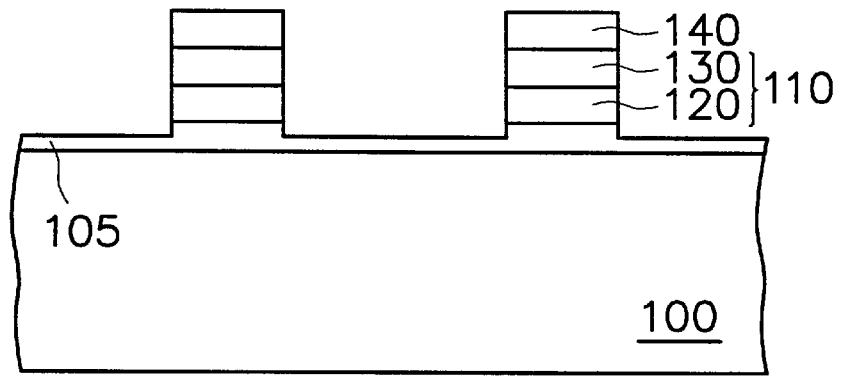
FIGS. 1A to 1C are schematic, cross-sectional views illustrating a conventional self-aligned contact process.
Figure 1B:
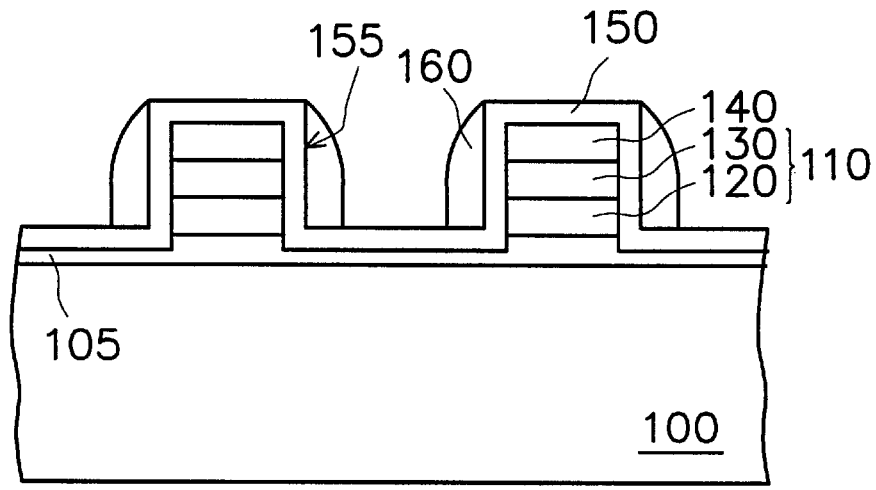
Figure 1C:
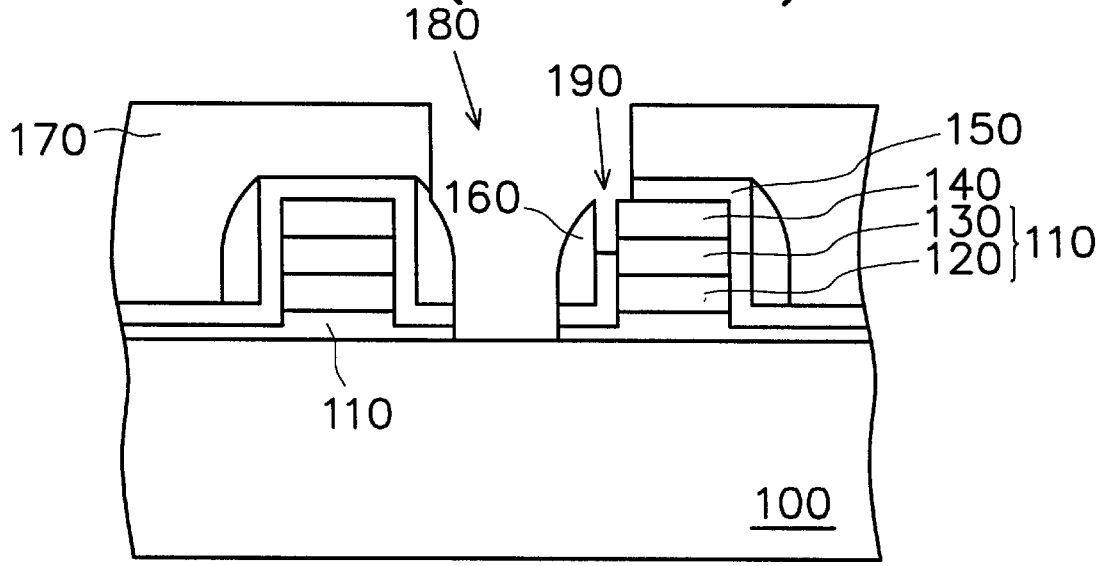
Figure 2A:
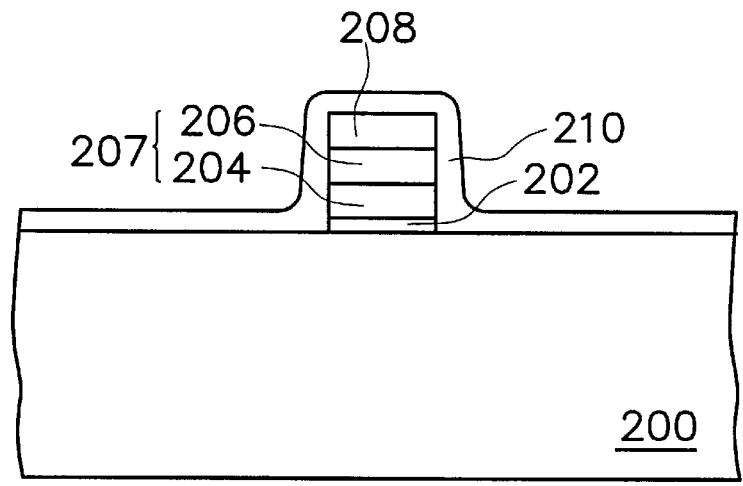
FIGS. 2A to 2G are schematic, cross-sectional views illustrating one preferred embodiment of the self-aligned contact process in accordance with the present invention.

In FIG. 2A, a gate oxide layer 202 is provided on a semiconductor substrate 200, which is formed, for example, by thermal oxidation. A gate structure 207 is formed on the gate oxide layer 202, which gate structure 207 comprises at least a doped polysilicon layer 204 and a silicide layer 206. A suitable material for suicide 206 is tungsten silicide or titanium silicide. A cap layer 208 is overlaid on the top surface of the gate structure 207, the material of which is, for example, silicon nitride. A first insulating layer 210 with a thickness of about 100–200 Å is formed over the structure described above. The preferred material of the first insulating layer 210 is, for example, silicon nitride.

Figure 2B:
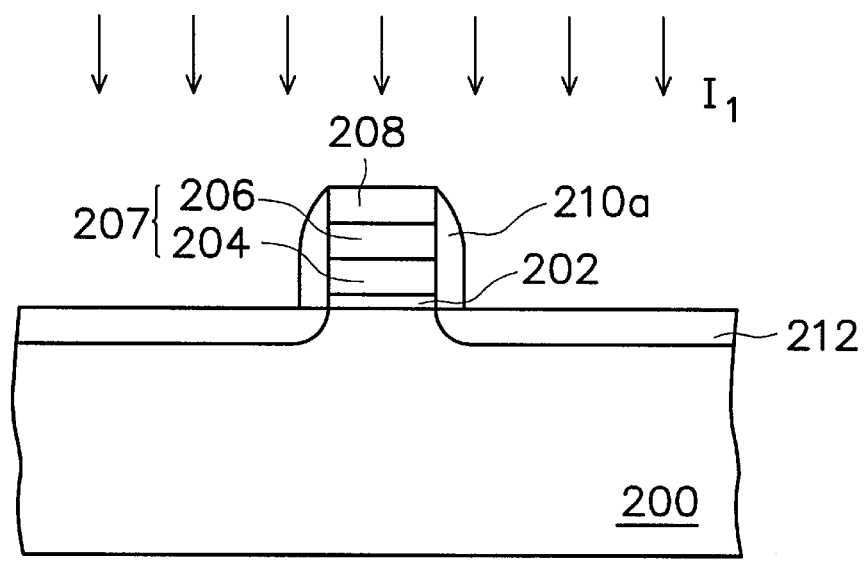

In FIG. 2B, a part of the first insulating layer 210 is removed by, for example, etching back or anisotropic etching until exposing the cap layer 208. The remaining first insulating layer 210a is used as a first spacer on the sidewall of the gate structure 207. Using the gate structure 207 and the first spacer as a mask, an ion implanting process $I_1$ is performed. An impurity is thus implanted into the substrate 200. A thermal process is performed to drive-in the impurity to form lightly doped regions 212.

Figure 2C:
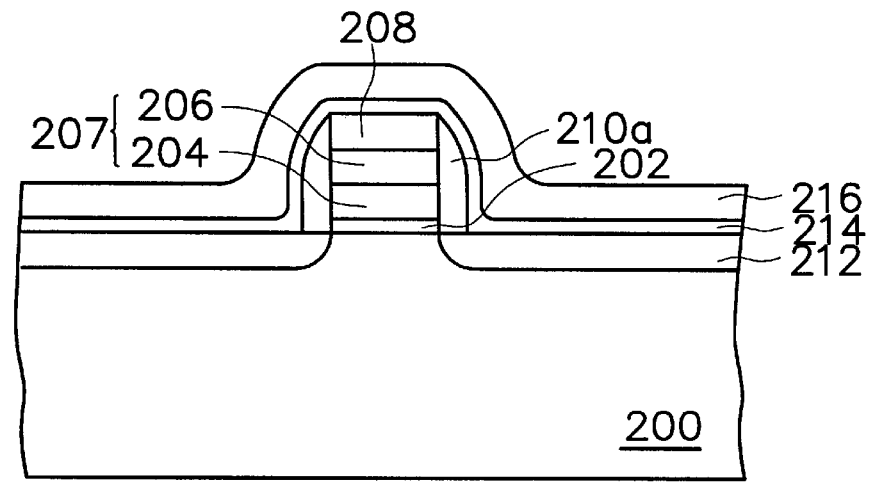

In FIG. 2C, a conformal liner layer 214 is formed on the structure shown in FIG. 2B. The preferred material of the liner layer 214 is, for example, silicon oxide. A second insulating layer 216 with a thickness of about 800–1000 Å is formed on the liner layer 214. The preferred material of the second insulating layer 216 is, for example, silicon nitride.

Figure 2D:
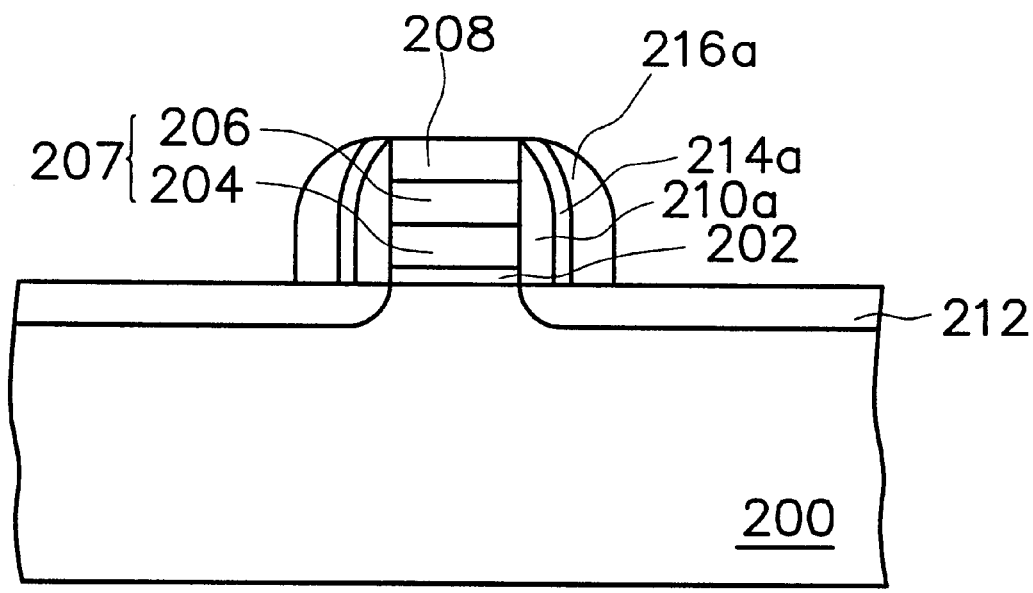

In FIG. 2D, the second insulating layer 216 and the liner layer 214 are partially removed by, for example, etching back or anisotropic etching. A part of the liner layer 214a is left on the first spacer 210a. The remaining second insulating layer 216a on the liner layer 214a is used as a second spacer 216a.

Figure 2E:
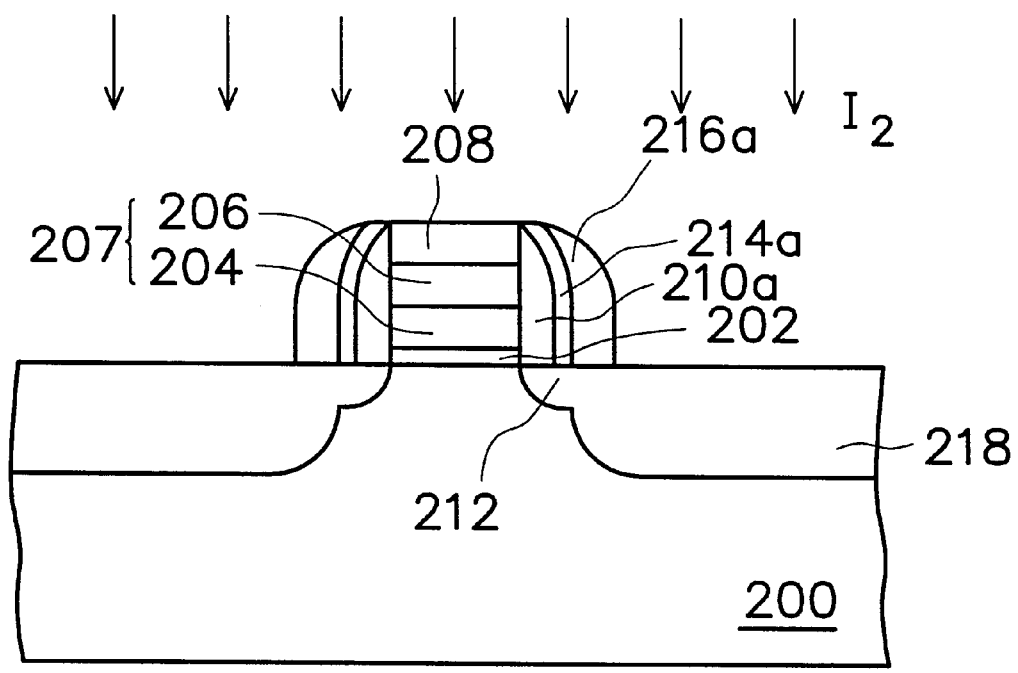

In FIG. 2E, another ion implanting process $I_2$ is performed and the impurity is driven into the substrate 200 to form source/drain regions 218. The source/drain regions 218 and the lightly doped regions 212 constitute source/drain regions with lightly doped drain (LDD) structures.

Figure 2F:
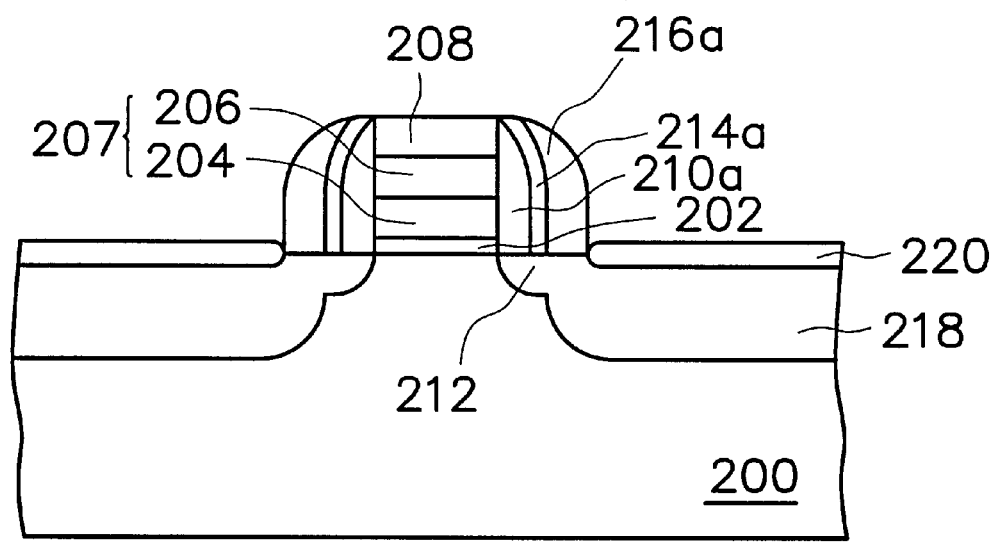

In FIG. 2F, a metal silicide layer 220, such as titanium silicide, is formed on the source/drain regions 218 by, for example, self-alignment. Forming the metal silicide layer 220 comprises steps of forming a metal layer (not shown) over the structure shown in FIG. 2E, performing a thermal process to make the metal layer react with the source/drain regions to form metal silicide and removing the unreacted metal layer. The metal silicide layer 220 is thus formed on the source/drain regions 218.

Figure 2G:
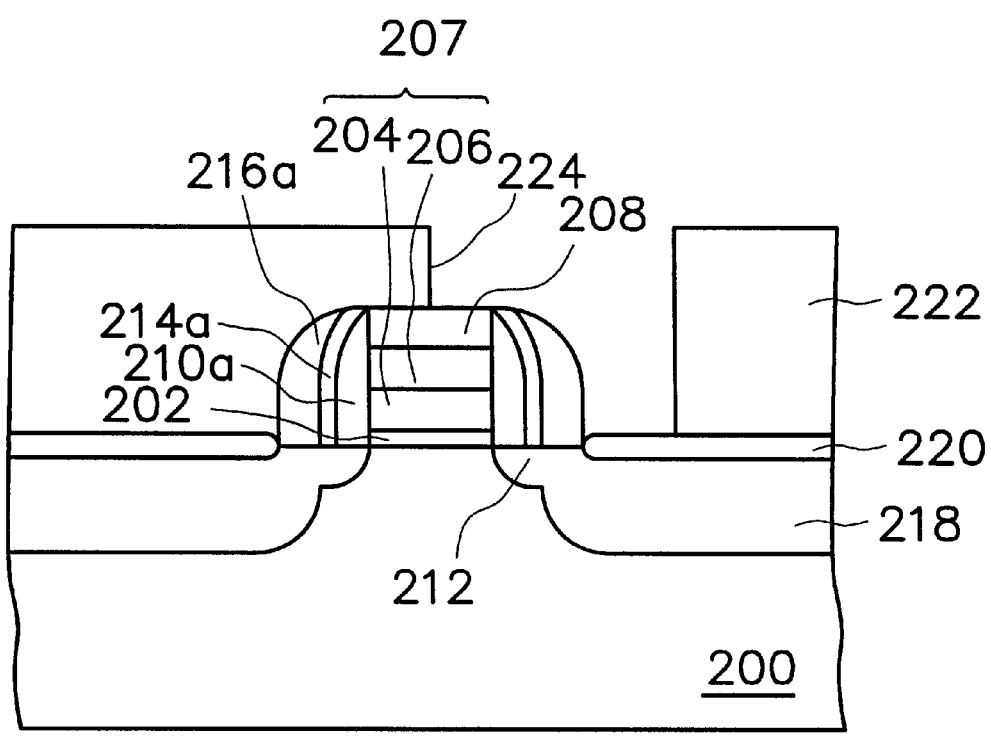

In FIG. 2G, an inter-layer dielectric layer 222, such as a silicon oxide layer, is formed on the structure shown in FIG. 2F. A lithography and etching process is performed to partially remove the inter-layer dielectric layer 222, forming a contact opening 224 that exposes a part of the source/drain regions 218.

The cap layer 208, the first spacer 210a and the second spacer 216a are all made of the same material, silicon nitride, and are different from the inter-layer dielectric layer 222 which comprises silicon oxide. An etchant with a high selectivity of $SiO_2/SiN$ is used while etching the inter-layer dielectric layer 222. The etching process is disrupted while exposing the silicon nitride so that the contact opening exposing the source/drain regions 218 is self-aligned. That means the self-aligned contact process has a larger process window than a conventional method of forming a contact.

The invention provides a self-aligned contact process to form a mini first spacer as an offset spacer on the sidewall of the gate. The liner layer and the interlayer dielectric layer are made of the same material so that a part of the liner layer on the first spacer may be etched while forming the contact opening. The first spacer can protect the gate from being damaged while forming the contact opening in the inter-layer dielectric layer. A conductive material filled in the contact opening does not contact with the gate so that degradation of the isolation between the gate and the source/drain region can thus be prevented.

Furthermore, the first spacer serves as an offset spacer. The lightly doped regions are formed after forming the first spacer so that a channel distance between the lightly doped regions under the gate becomes longer than a conventional channel distance. Short channel effect can thus be prevented. The gate, the gate oxide layer and the lightly doped regions constitute a structure of a parasitic capacitor. A capacitance of the parasitic decreases according to increases in the distance between the lightly doped regions.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A self-aligned contact process for formation of a contact opening on a semiconductor substrate comprising:
   at least providing the semiconductor substrate with a gate structure thereon, wherein a cap layer is formed on the gate structure;
   forming a first insulating layer on the substrate;
   removing a part of the first insulating layer to form a first spacer on a sidewall of the gate structure and the cap layer;
   performing a first ion implantation to form lightly doped regions in the substrate using the gate structure and the first spacer as a mask;
   forming a liner layer on the substrate, the cap layer and the first spacer; forming a second insulating layer on the liner layer;
   removing a part of the second insulating layer and a part of the liner layer until exposing the cap layer to form a second spacer and leave another part of the liner layer on the first spacer;
   performing a second ion implantation to form source/drain regions in the substrate;

forming a metal salicide layer on the source/drain regions;

forming an inter-layer dielectric layer on the cap layer, the second spacer and the metal salicide layer; and removing a part of the inter-dielectric layer to form a contact opening exposing a part of the source/drain regions.

2. The method according to claim 1, wherein the cap layer comprises silicon nitride.

3. The method according to claim 1, wherein a material of the first insulating layer and the second insulating layer comprises silicon nitride.

4. The method according to claim 1, wherein a thickness of the first insulating layer is about 100–200 Å.

5. The method according to claim 1, wherein a thickness of the second insulating layer is about 800–1000 Å.

6. The method according to claim 1, wherein a material of the liner layer comprises silicon oxide.

7. The method according to claim 1, wherein the gate structure further comprises a polysilicon layer on the substrate and a metal silicide layer on the polysilicon layer.

8. The method according to claim 1, wherein the metal silicide layer comprises titanium silicide formed by self-alignment.

9. A self-aligned contact process for formation of a contact opening on a semiconductor substrate, comprising:

forming a gate oxide layer on the semiconductor substrate;

forming a gate structure on the gate oxide layer, wherein the gate structure comprises at least a doped polysilicon layer, a silicide layer, and a cap layer;

forming a first insulating layer over the gate structure;

removing a part of the first insulating layer to form a first spacer on a sidewall of the gate structure;

performing a first ion implantation to form lightly doped regions in the substrate using the gate structure and the first spacer as a mask;

forming a liner layer on the gate structure and the first spacer;

forming a second insulating layer on the liner layer;

removing a part of the second insulating layer to form a second spacer and removing a part of the liner layer to leave a part of the liner layer on the first spacer;

performing a second ion implantation to form source/drain regions in the substrate;

forming a metal salicide layer on the source/drain regions;

forming an inter-layer dielectric layer on the cap layer, the second spacer and the metal salicide layer; and removing a part of the inter-dielectric layer to form a contact opening exposing a part of the source/drain regions.

* * * * *